United States Patent
Long et al.

(10) Patent No.: US 10,647,335 B2
(45) Date of Patent: May 12, 2020

(54) MOUNTING AND SECURING AIR CONDITIONER (AC) UNIT AND AC CAGE BEING WALL MOUNTED ON RAILWAY INSTRUMENT HOUSE

(71) Applicant: Siemens Industry Inc., Alpharetta, GA (US)

(72) Inventors: Zhenzhong Long, Prospect, KY (US); Anthony Ray, Louisville, KY (US)

(73) Assignee: SIEMENS MOBILITY, INC., New York, NY (US)

( * ) Notice: Subject to any disclaimer, the term of this patent is extended or adjusted under 35 U.S.C. 154(b) by 184 days.

(21) Appl. No.: 15/498,953

(22) Filed: Apr. 27, 2017

(65) Prior Publication Data

US 2017/0363319 A1    Dec. 21, 2017

Related U.S. Application Data

(60) Provisional application No. 62/351,025, filed on Jun. 16, 2016.

(51) Int. Cl.
| | |
|---|---|
| *F16B 39/284* | (2006.01) |
| *F16B 37/06* | (2006.01) |
| *F24F 13/20* | (2006.01) |
| *B61D 27/00* | (2006.01) |
| *H05K 7/20* | (2006.01) |

(52) U.S. Cl.
CPC ............ *B61D 27/00* (2013.01); *F16B 37/067* (2013.01); *H05K 7/20* (2013.01)

(58) Field of Classification Search
CPC ...... F16L 55/265; F16L 41/082; B61D 27/00; F16B 37/067; H05K 7/202
See application file for complete search history.

(56) References Cited

U.S. PATENT DOCUMENTS

| 3,745,607 | A  | * | 7/1973  | Cleff ....................... E05D 5/023 16/252 |
|---|---|---|---|---|
| 9,388,999 | B2 | * | 7/2016  | De Jesus .................. E06B 7/28 |
| 2003/0101662 | A1 | * | 6/2003  | Ullman .................. E04D 13/12 52/27 |
| 2015/0369274 | A1 | * | 12/2015 | Stojkovic ............. F16B 37/067 411/181 |

FOREIGN PATENT DOCUMENTS

CN        204492262    *    7/2015

* cited by examiner

*Primary Examiner* — John C Hong

(57) ABSTRACT

A mounting assembly for mounting a wall mounted air conditioner (AC) unit on a railway instrument house is provided. The mounting assembly may include a house wall including an outer metal shell layer, a middle insulation layer and an inner plywood layer. The mounting assembly may further include a threaded part coupled to the outer metal shell layer. The threaded part is configured to receive an AC mounting hardware of the wall mounted air conditioner (AC) unit to secure the wall mounted air conditioner (AC) unit to the house wall such that the threaded part enables the wall mounted air conditioner (AC) unit to be installed or removed from outside of the railway instrument house. The mounting assembly may further include an AC unit cage for protecting the wall mounted air conditioner (AC) unit. The AC unit cage has at least two side doors and a front door such that each side door of the at least two side doors is locked within the front door by corresponding bolts or a quick lock. The AC unit cage is configured for mounting on the house wall.

5 Claims, 7 Drawing Sheets

Before Compression · After Compression

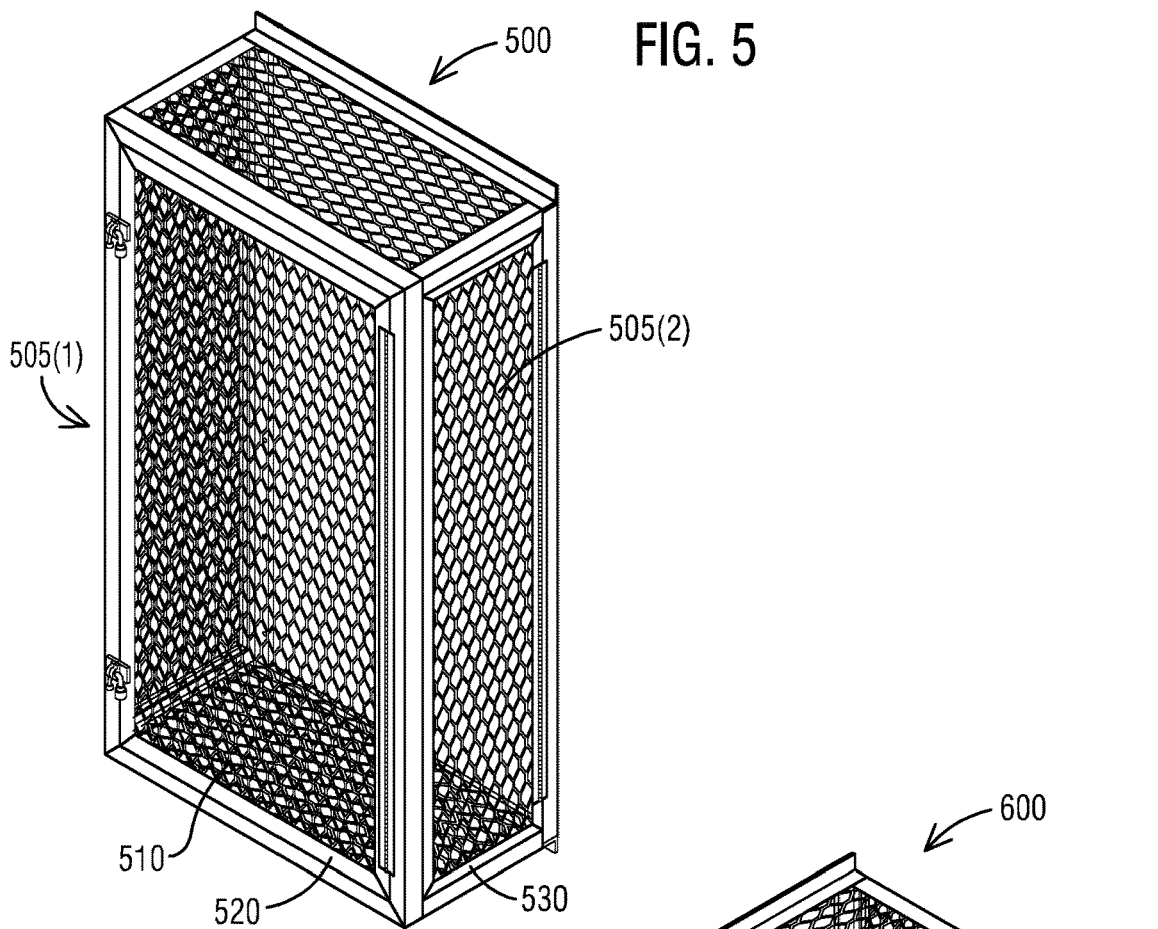

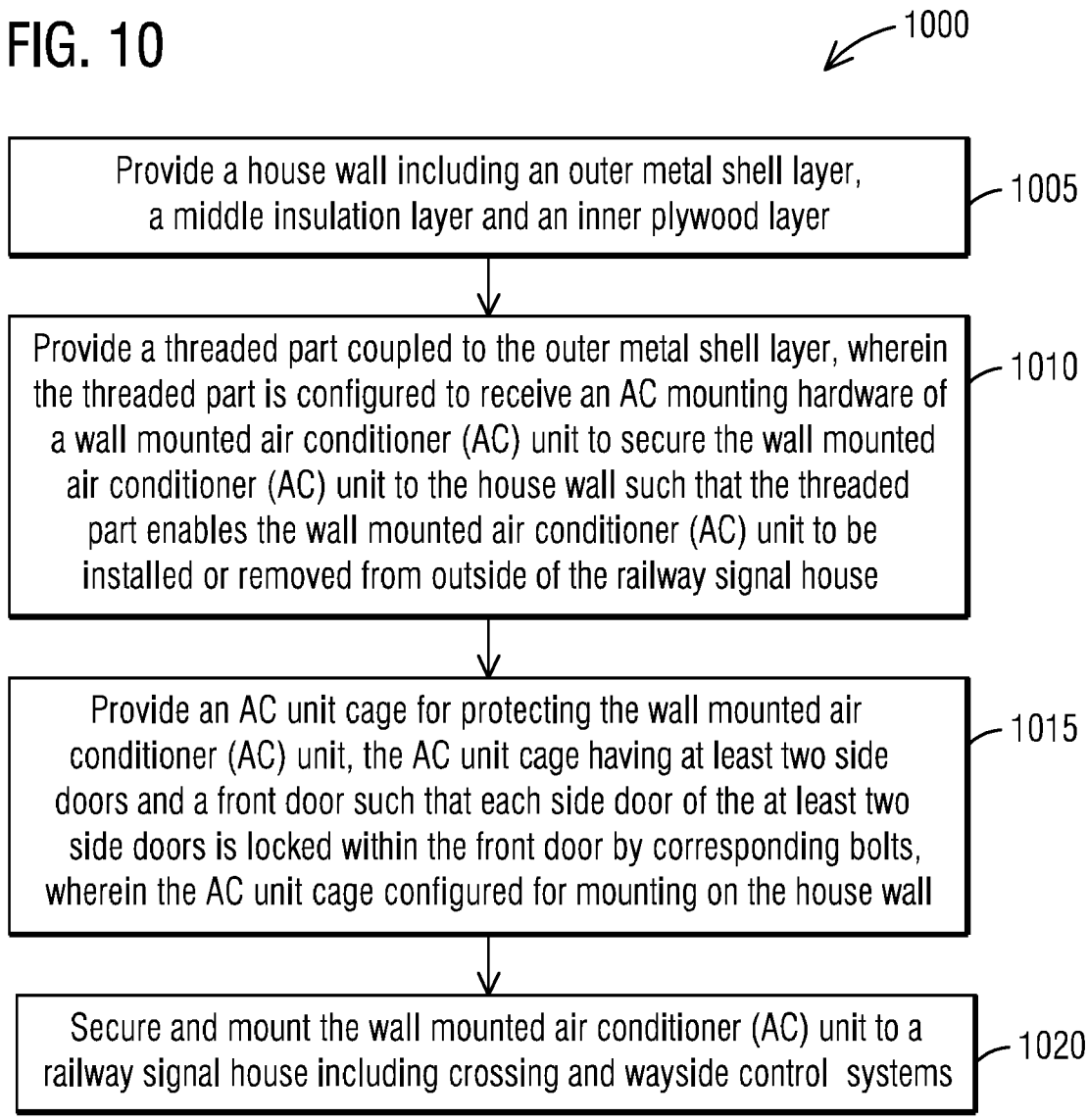

MOUNTING AND SECURING AIR CONDITIONER (AC) UNIT AND AC CAGE BEING WALL MOUNTED ON RAILWAY INSTRUMENT HOUSE

CROSS REFERENCE TO RELATED APPLICATIONS

This application claims the benefit of U.S. Provisional Application Ser. No. 62/351,025 entitled "AC MOUNTING AND SECURITY METHOD FOR RAILWAY HOUSES," filed on Jun. 16, 2016, the contents of which are hereby incorporated by reference herein in their entirety.

BACKGROUND

1. Field

Aspects of the present invention generally relate to mounting and securing an air conditioner (AC) unit being wall mounted on a railway instrument house and more specifically relate to a mounting assembly including a threaded part which enables the air conditioner (AC) unit to be installed or removed from outside of the railway instrument house.

2. Description of the Related Art

Railway companies require a temperature controlled environment for their communication and signal control houses. This requirement is addressed by adding an air conditioner/heater to the traditional instrument house structure. A railway company requires a robust solution that will provide many years of reliable service and low maintenance. However, an installation and security solution is only as good as its weakest link. To provide a railway company with a viable solution all potential failures must be addressed. For example, an air conditioner (AC) unit mounting and security of an AC cage has been identified as potential failure points.

Current installation and security designs do not address providing an efficient method for applying an air conditioner (AC) unit to a railway communication and signal control house. For example, they do not address the following issues such as—maintenance issues, energy efficiency, poor space utilization, and security/vandalism concerns. Typically make shift applications have been applied which include residential wall mount units and recreational AC units which yield short term and unsatisfactory results.

Therefore, there is a need for a more efficient and secure installation and security solution for an air conditioner (AC) unit mounting and security of an AC cage both of which are wall mounted to a house wall of a railway communication and signal control house.

SUMMARY

Briefly described, aspects of the present invention relate to a mounting assembly including a threaded part which enables an air conditioner (AC) unit to be installed or removed from outside of a railway instrument house. Embodiments of the present invention provide more efficient and secure installation and security solution for an air conditioner (AC) unit mounting and security of an AC cage both of which are wall mounted on to a house wall of a railway instrument house.

In accordance with one illustrative embodiment of the present invention, a mounting assembly for mounting a wall mounted air conditioner (AC) unit on a railway instrument house is provided. The mounting assembly may include a house wall including an outer metal shell layer, a middle insulation layer and an inner plywood layer. The mounting assembly may further include a threaded part coupled to the outer metal shell layer. The threaded part is configured to receive an AC mounting hardware of the wall mounted air conditioner (AC) unit to secure the wall mounted air conditioner (AC) unit to the house wall such that the threaded part enables the wall mounted air conditioner (AC) unit to be installed or removed from outside of the railway instrument house.

In accordance with another illustrative embodiment of the present invention, a mounting assembly for mounting a wall mounted air conditioner (AC) unit on a railway instrument house is provided. The mounting assembly may include a house wall including an outer metal shell layer, a middle insulation layer and an inner plywood layer. The mounting assembly may further include an AC unit cage for protecting the wall mounted air conditioner (AC) unit. The AC unit cage has at least two side doors and a front door such that each side door of the at least two side doors is locked within the front door by corresponding bolts or a quick lock. The AC unit cage is configured for mounting on the house wall.

In accordance with another illustrative embodiment of the present invention, a method of securing and mounting a wall mounted air conditioner (AC) unit to a railway instrument house including crossing and wayside control systems is provided. The method includes providing a house wall including an outer metal shell layer, a middle insulation layer and an inner plywood layer, providing a threaded part coupled to the outer metal shell layer and providing an AC unit cage for protecting the wall mounted air conditioner (AC) unit. The threaded part is configured to receive an AC mounting hardware of the wall mounted air conditioner (AC) unit to secure the wall mounted air conditioner (AC) unit to the house wall such that the threaded part enables the wall mounted air conditioner (AC) unit to be installed or removed from outside of the railway instrument house. The AC unit cage having at least two side doors and a front door such that each side door of the at least two side doors is locked within the front door by corresponding bolts, wherein the AC unit cage configured for mounting on the house wall.

BRIEF DESCRIPTION OF THE DRAWINGS

FIG. 5 illustrates a perspective view of an AC cage in accordance with an exemplary embodiment of the present invention.

FIG. 6 illustrates a perspective view of an AC cage with a front door removed in accordance with an exemplary embodiment of the present invention.

FIG. 10 illustrates a flow chart of a method of securing and mounting a wall mounted air conditioner (AC) unit to a railway instrument house according to an exemplary embodiment of the present invention.

DETAILED DESCRIPTION

To facilitate an understanding of embodiments, principles, and features of the present invention, they are explained hereinafter with reference to implementation in illustrative embodiments. In particular, they are described in the context of being a mounting assembly including a threaded part for securing and mounting a wall mounted air conditioner (AC) unit to a railway instrument house. Threaded parts are pre-installed inside a metal shell of the railway instrument house so that the AC unit and an AC cage may be installed from outside of the railway instrument house. Cage mounting bolts are changed from the outside of the AC cage to inside of the AC cage. A locking mechanism of the AC cage side doors is provided inside of the AC cage instead of the outside of the AC cage. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

Figure 1:
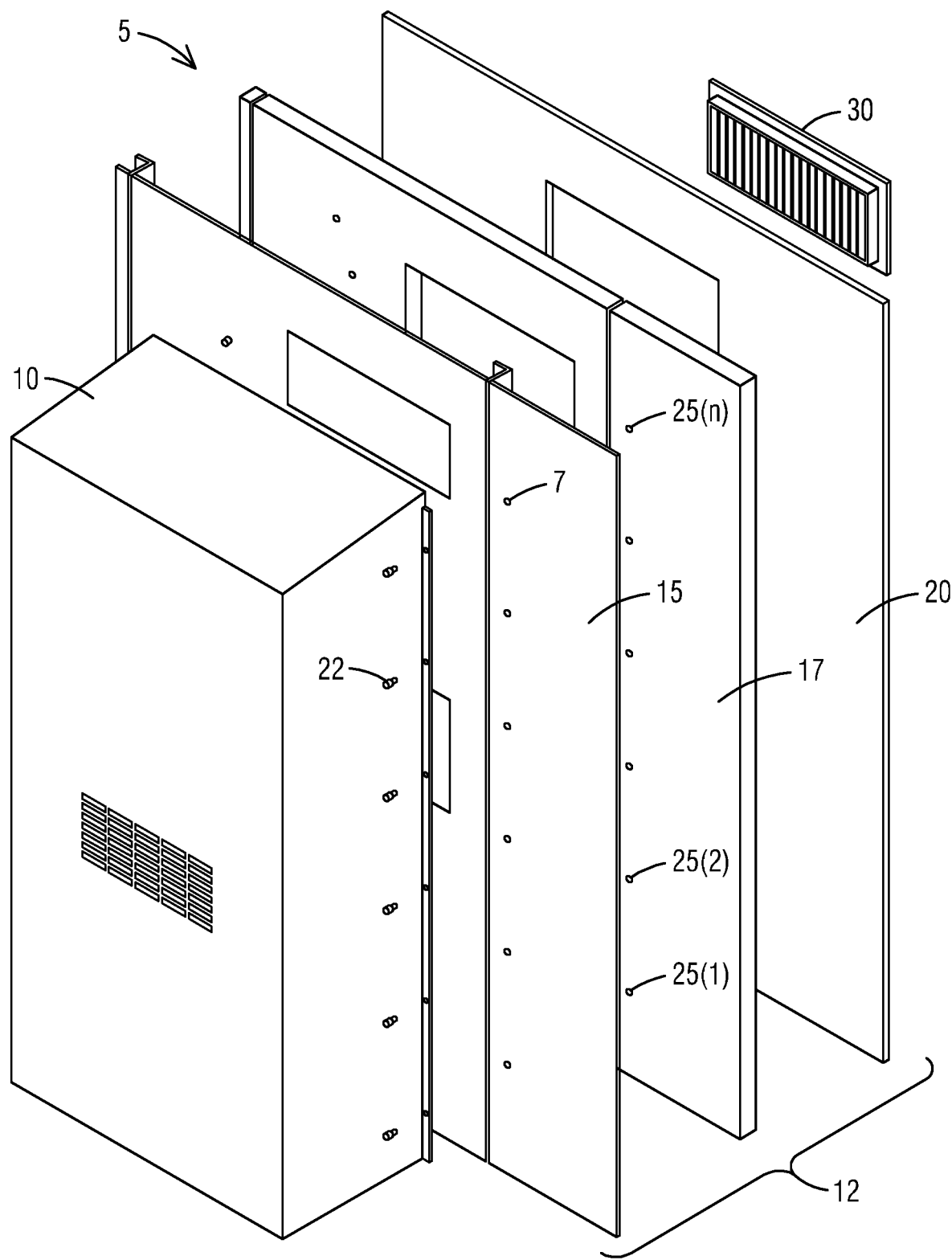
FIG. 1 illustrates an exploded view of a mounting assembly including a threaded part which enables an air conditioner (AC) unit to be installed or removed from outside of a railway instrument house in accordance with an exemplary embodiment of the present invention.

Consistent with one embodiment of the present invention, FIG. 1 represents an exploded view of a mounting assembly 5 including a threaded part 7 which enables an air conditioner (AC) unit 10 to be installed or removed from outside of a railway instrument house (not shown) in accordance with an exemplary embodiment of the present invention. The mounting assembly 5 is configured for mounting a wall mounted air conditioner (AC) unit such as the AC unit 10 on the railway instrument house which includes crossing and wayside control systems of a railway system. In one embodiment, the mounting assembly 5 comprises a house wall 12 including an outer metal shell layer 15, a middle insulation layer 17 and an inner plywood layer 20. The house wall 12 is a wall structure of the railway instrument house.

For installation of the air conditioner (AC) unit 10, no holes are to be cut in the middle insulation layer 17 and the inner plywood layer 20. The mounting assembly 5 eliminates the need to cut the inner plywood layer 20 which results in more space for mounting equipment and wiring, and also looks neater. The mounting assembly 5 also eliminates the need to cut the middle insulation layer 17, which has good heat resistance.

The mounting assembly 5 further comprises the threaded part 7 coupled to the outer metal shell layer 15. The threaded part 7 is configured to receive an AC mounting hardware of the air conditioner (AC) unit 10 to secure the air conditioner (AC) unit 10 to the house wall 12 such that the threaded part 7 enables the air conditioner (AC) unit 10 to be installed or removed from outside of the railway instrument house.

Consistent with one embodiment of the present invention, the threaded part 7 is a nut or an insert that eliminates a need to have a person inside the railway instrument house during installation and disassembly of the air conditioner (AC) unit 10. As one example, the nut may be a rivet nut with internal threads for placing permanent threads in the outer metal shell layer 15 such that once in place the internal threads are ready for a screw or a bolt. The rivet nut may have a flange that extends above the outer metal shell layer 15 in which it is installed.

As used herein, "a threaded part" refers to a nut or an insert configured as a fastener such as a rivet nut. As used herein, "a stud" refers to a screw or a bolt that allows a screw-on component to be prefixed to a carrier component. The rivet nut and stud provides a solution for fastening resilient nut/bolt threads to a thin-walled component such as a metal wall. The rivet nut and stud can include multiple interacting parts, whether located together or apart, that together perform processes as described herein.

The techniques described herein can be particularly useful for using a rivet nut. While particular embodiments are described in terms of the rivet nut, the techniques described herein are not limited to the rivet nut but can also use other nuts such as threaded inserts.

The mounting assembly 5 further comprises AC cage mounting hardware 22. The air conditioner (AC) unit 10 uses the AC cage mounting hardware 22 for mounting an AC cage onto it. The middle insulation layer 17 includes a plurality of small shallow blind holes **25(1-*n*). Inside the railway instrument house (not shown), the mounting assembly 5 further comprises an AC grille 30**.

The Railroads use metal instrument houses to accommodate their crossing and wayside control systems. A typical house wall is constructed in layers: metal shell, plywood and insulation. The insulation provides a resistant layer which reduces heat both entering the house in summer and exiting the house in winter. The plywood is utilized for mounting equipment and to secure wiring.

In a current design of AC mounting, when a wall mounted air conditioner (AC), such as the commercial brand Bard is required, a common design practice is to cut the plywood and insulation for bolting the AC unit to the metal shell. Due to this cut, the plywood utilized in the area of the AC cannot be used for equipment mounting or wiring and the insulation value of the wall is weakened. Another drawback of this design is that the AC installation or disassembly requires two people—one person must be inside the railway instrument house to tighten or to loosen the AC mounting hardware and another person must be outside to complete the install or removal.

Consistent with one embodiment of the present invention, an AC mounting method adds threaded parts, like a rivet nut to the metal shell. This allows the AC unit 10 to be installed or removed from outside of the house. This eliminates the need to have a person inside the railway instrument house during the installation and disassembly processes. By using the threaded/rivet nut design there is no longer a need to cut sections out of the insulation and plywood to facilitate the mounting of the AC unit 10.

Figure 2:
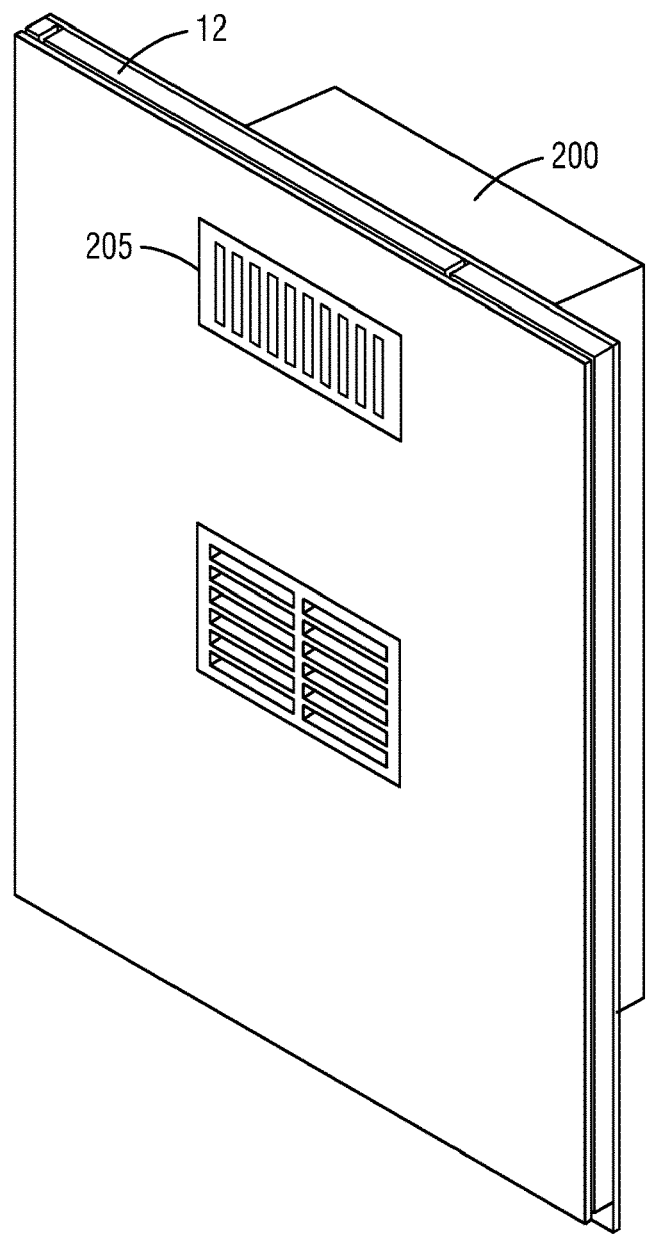
FIG. 2 illustrates a perspective view of a wall mounted air conditioner (AC) unit from inside of a railway instrument house in accordance with an exemplary embodiment of the present invention.

Referring to FIG. 2, it illustrates a perspective view of a wall mounted air conditioner (AC) unit 200 from inside of a railway instrument house in accordance with an exemplary embodiment of the present invention. The wall mounted air conditioner (AC) unit 200 includes an AC grille 205.

Figure 3:
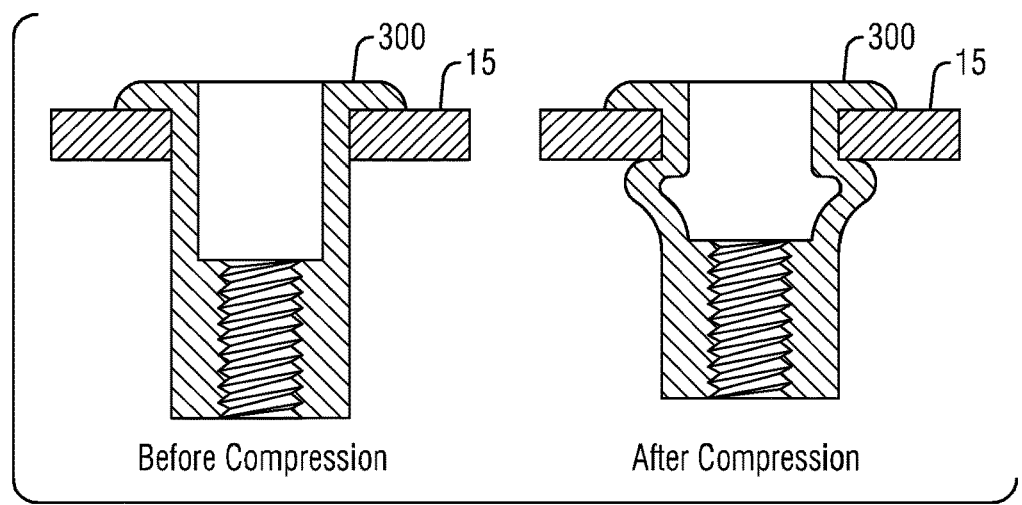
FIG. 3 illustrates a cross sectional view of a rivet nut before compression a cross sectional view of a rivet nut after compression in accordance with an exemplary embodiment of the present invention.

Turning now to FIG. 3, it illustrates a cross sectional view of a rivet nut 300 before compression and a cross sectional view of the rivet nut 300 after compression in accordance with an exemplary embodiment of the present invention. The rivet nut 300 is compressed onto a metal wall such as the outer metal shell layer 15 before the wall mounted air conditioner (AC) unit 200 and an AC cage are installed. The rivet nut 300 comes in without compression. It was compressed after it was installed on to the outer metal shell layer 15.

The rivet nut 300 includes a deformable shank or body. Hand tools and pneumatic equipment are available for installing the rivet nut 300. The rivet nut 300 and studs based solution is the most versatile solution for fastening. The materials used for the rivet nut 300 ought to offer excellent plasticity in the compression zone.

Figure 4:
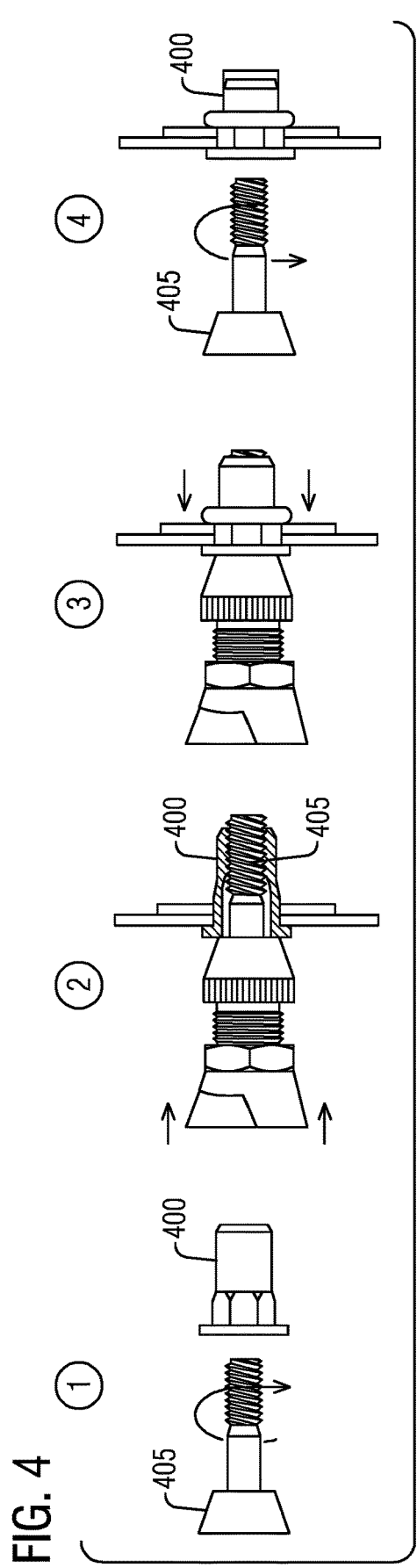
FIG. 4 illustrates a schematic view of a setting process of a rivet nut in accordance with an exemplary embodiment of the present invention.

FIG. 4 illustrates a schematic view of a setting process of a rivet nut 400 in accordance with an exemplary embodiment of the present invention. The rivet nut 400 and a stud 405 provides a solution for fastening resilient nut/bolt threads to a thin-walled component such as the outer metal shell layer 15. Setting is done using an example of a spindle stroke process which includes four steps: (1). Spin on (2). Insert (3). Upset and (4). Spin off.

The rivet nut 400 may be made of steel, stainless steel or aluminum. For example, it may be made from standard stainless steel or A1 or A2 austenitic steel with 18% chromium and 10% nickel. The rivet nut 400 may have different head shapes including a flat head, a countersunk head and an extra small countersunk head. The rivet nut 400 may have different shank ends including an open and a closed. The rivet nut 400 may have different shank shapes including a round and a plain, a round and knurled, a hexagonal shank and a part hexagonal shank.

The stud 405 allows a screw-on component to be prefixed to a carrier component. This is particularly helpful for heavy or large parts or with concealed assembly ("hang on" assembly). The rivet nut 400 and the stud 405 enable one-side assembly solution for components with limited access just from one side. The rivet nut 400 and the stud 405 create load-bearing nut and bolt threads on thin walls where cut threads are unsuitable. The rivet nut 400 and the stud 405 provide a solution where aesthetic appearance and the ability to seal against the elements is essential.

Railroad houses are located in remote and secluded locations. An AC cage is needed to secure the AC unit 10 and deter vandalism. As with the current AC mounting design, the AC cage uses a bolt fastening method that requires cuts in the insulation and plywood. Since the bolts are outside of the AC cage, carriage bolts are utilized. For AC maintenance, the AC cage has a front door and two side doors. Current cage design needs six expensive railroad padlocks to secure these points. For this design, the AC cage must be disassembled to replace the AC unit 10.

Consistent with one embodiment of the present invention, an AC cage for AC security includes two side doors that are locked within a front door by bolts or similar mechanism. The access to these bolts is blocked by a front door frame. This design feature eliminates the need for four railroad padlocks. A plurality of cage mounting holes is located inside the AC cage. Access to the cage mounting bolts is blocked by a side door frame. This AC cage has a larger front door, which allows a customer to replace the AC unit 10 without removing the AC cage.

As seen in FIG. 5, it illustrates a perspective view of an AC unit cage 500 in accordance with an exemplary embodiment of the present invention. The AC unit cage 500 comprises at least two side doors 505(1-2) and a front door 510 such that each side door 505 of the at least two side doors 505(1-2) is locked within the front door 510 by corresponding bolts or a quick lock. An access to the corresponding bolts or the quick lock is blocked by a front door frame 520 of the front door 510. The AC unit cage 500 further comprises a plurality of cage mounting holes (seen in FIG. 6 only) for mounting the AC unit cage 500 to the house wall (not shown). The plurality of cage mounting holes 525(1-n) are located inside the AC unit cage 500.

The mounting assembly 5 of FIG. 1 further comprises a plurality of cage mounting bolts (not shown). The access to the plurality of cage mounting bolts is blocked by a side door frame 530 of the each side door of the at least two side doors 505(1-2). The AC unit cage 500 has the front door 510 sized such that it allows a customer to replace the wall mounted air conditioner (AC) unit 200 without removing the AC unit cage 500.

As shown in FIG. 6, it illustrates a perspective view of an AC unit cage 600 with a front door removed in accordance with an exemplary embodiment of the present invention. The AC unit cage 600 comprises a plurality of cage mounting holes 605(1-n) for mounting the AC unit cage 600 to the house wall (not shown). The AC unit cage 600 further comprises first and second side door lock hardware 610(1-2). The AC unit cage 600 further comprises first and second front door padlocks 615(1-2).

Figure 7:
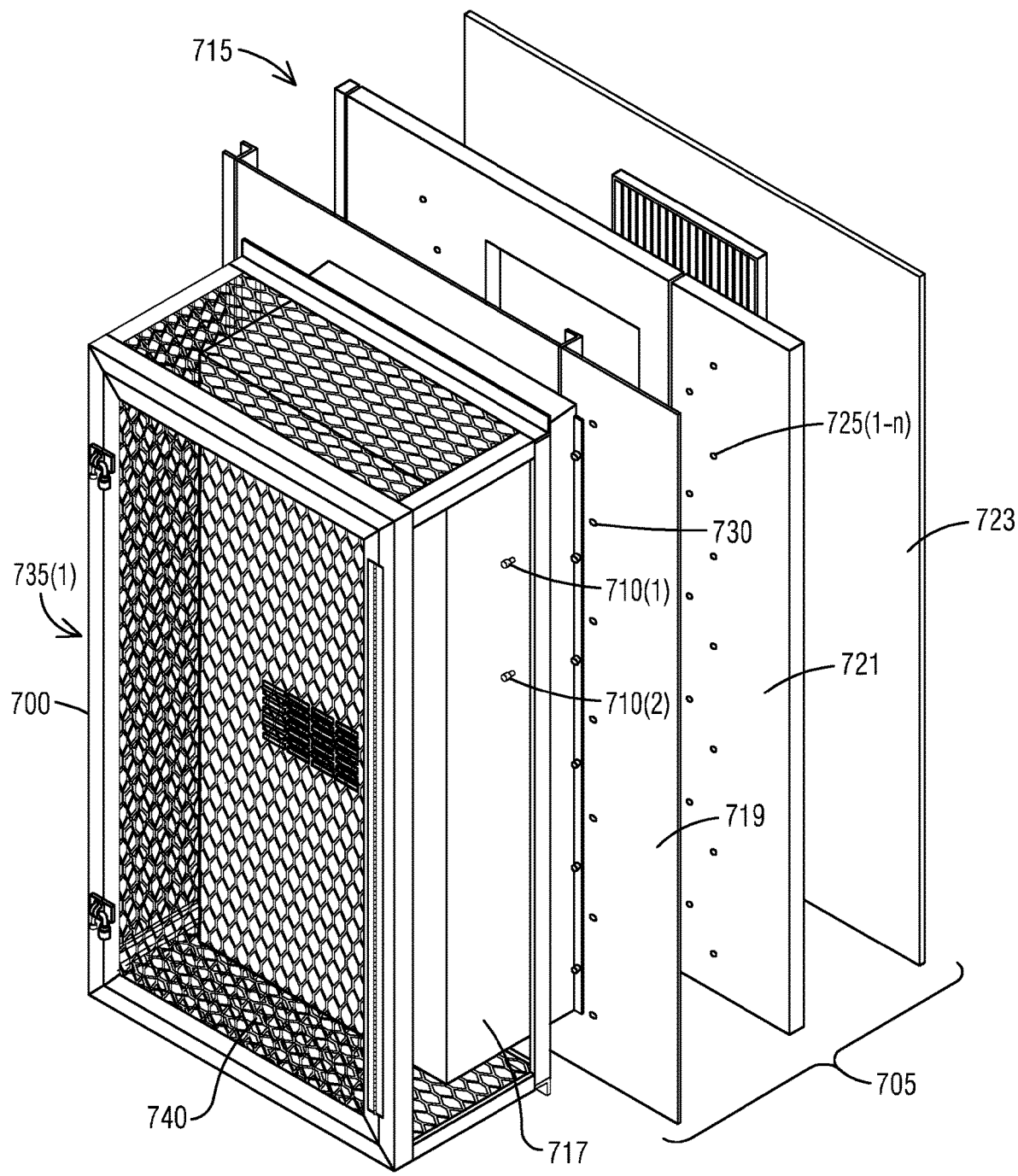
FIG. 7 illustrates an exploded view of an AC cage mounted to a house wall of a railway instrument house in accordance with an exemplary embodiment of the present invention.

In FIG. 7, it illustrates an exploded view of an AC unit cage 700 mounted to a house wall 705 of a railway instrument house (not shown) in accordance with an exemplary embodiment of the present invention. The AC unit cage 700 comprises first and second AC cage mounting hardware 710(1-2).

A mounting assembly 715 configured to mount a wall mounted AC unit 717 comprises the house wall 705 including an outer metal shell layer 719, a middle insulation layer 721 and an inner plywood layer 723. The middle insulation layer 721 comprises a plurality of small and shallow blind holes 725(1-n). The outer metal shell layer 719 comprises a threaded part 730. The treaded part 730 may be a rivet nut configured to receive a bolt or a stud as explained earlier.

The mounting assembly comprising the house wall 705 including the outer metal shell layer 719, the middle insulation layer 721, the inner plywood layer 723 and the AC unit cage 700 for protecting the wall mounted air conditioner (AC) unit 717. The AC unit cage 700 having at least two side doors 735(1-2) (only one side door shown) and a front door 740 such that each side door of the at least two side doors 735(1-2) is locked within the front door 740 by corresponding bolts or a quick lock. The AC unit cage 700 is configured for mounting on the house wall 705.

Figure 8:
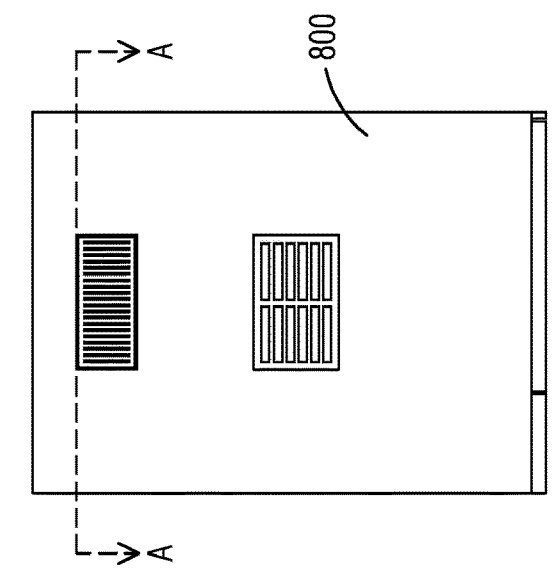
FIG. 8 illustrates a back view of a wall mounted air conditioner (AC) unit from inside of a railway instrument house in accordance with an exemplary embodiment of the present invention.

FIG. 8 illustrates a back view of a wall mounted air conditioner (AC) unit (not seen) and an AC unit cage (not seen) from inside of a railway instrument house in accordance with an exemplary embodiment of the present invention. A house wall 800 is seen.

Figure 9:
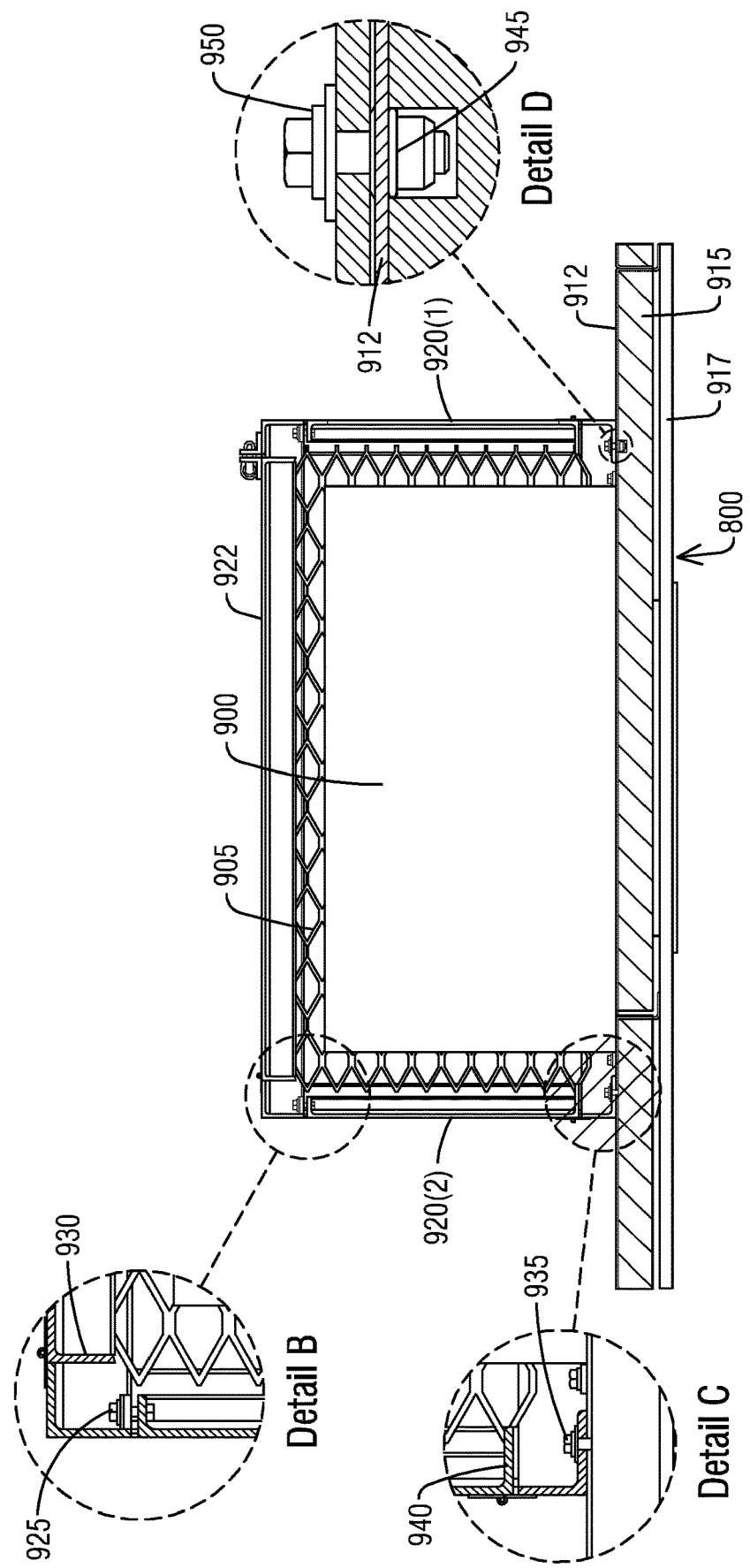
FIG. 9 illustrates a cross sectional view of the wall mounted air conditioner (AC) unit at a cross section A-A in FIG. 8 with detail views B, C, D in accordance with an exemplary embodiment of the present invention.

FIG. 9 illustrates a cross sectional view of the wall mounted air conditioner (AC) unit and the AC unit cage at a cross section A-A in FIG. 8 with detail views B, C, D in accordance with an exemplary embodiment of the present invention. In FIG. 9, a wall mounted air conditioner (AC) unit 900 and an AC unit cage 905 is shown mounted on the house wall 800. The house wall 800 includes an outer metal shell layer 912, a middle insulation layer 915 and an inner plywood layer 917. The AC unit cage 900 having at least two side doors 920(1-2) and a front door 922 such that each side door of the at least two side doors 920(1-2) is locked within the front door 922 by corresponding bolts or a quick lock.

In particular, as seen in detail B, a side door lock bolt 925 is shown locked within the front door 922 by a front door frame 930. That is, an access to the corresponding bolts or the quick lock (e.g., side door lock bolt 925) is blocked by the front door frame 930 of the front door 922. As seen in detail C, an AC cage mounting bolt 935 is shown locked within the side door 920(2) by a side door frame 940. That is, an access to the AC cage mounting bolt 935 is blocked by the side door frame 940 of the side door 920(1). As seen in detail D, a rivet nut 945 is shown mounted on the outer metal shell layer 912 after compression. The rivet nut 945 may have a flange 950 that extends above the outer metal shell layer 912 in which it is installed.

FIG. 10 illustrates a flow chart of a method 1000 of securing and mounting a wall mounted air conditioner (AC) unit to a railway instrument house according to an exemplary embodiment of the present invention. Reference is made to the elements and features described in FIGS. 1-9. It should be appreciated that some steps are not required to be performed in any particular order, and that some steps are optional.

The method 1000, in step 1005, includes providing a house wall including an outer metal shell layer, a middle insulation layer and an inner plywood layer. The method 1000, in step 1010, further includes providing a threaded part coupled to the outer metal shell layer. The threaded part is configured to receive an AC mounting hardware of the wall mounted air conditioner (AC) unit to secure the wall mounted air conditioner (AC) unit to the house wall such that the threaded part enables the wall mounted air conditioner (AC) unit to be installed or removed from outside of the railway instrument house.

The method 1000, in step 1015, further includes providing an AC unit cage for protecting the wall mounted air conditioner (AC) unit. The AC unit cage having at least two side doors and a front door such that each side door of the at least two side doors is locked within the front door by corresponding bolts. The AC unit cage is configured for mounting on the house wall. The method 1000, in step 1020, further includes securing and mounting a wall mounted air conditioner (AC) unit to a railway instrument house including crossing and wayside control systems.

In one embodiment, steps for installation of the rivet nut 400 include drilling a hole to correct diameter and threading fastener, i.e., the rivet nut 400 onto a tool mandrel and inserting into the hole. Then actuating the tool to properly set fastener, i.e., the rivet nut 400 into material such as the metal wall or the outer metal shell layer 15. The fastening operation can be completed with screwing a bolt or a screw such as the stud 405 with the proper thread. The rivet 400 and the stud 405 combination provides a consistent firm fastening.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the invention has been described with reference to specific embodiments. However, one of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. A mounting assembly for mounting a wall mounted air conditioner (AC) unit on a railway instrument house including crossing and wayside control systems, the mounting assembly comprising:
   a house wall including an outer metal shell layer, a middle insulation layer and an inner plywood layer; and
   a threaded part coupled to the outer metal shell layer, wherein the threaded part is configured to receive an AC mounting hardware of the wall mounted air conditioner (AC) unit to secure the wall mounted air conditioner (AC) unit to the house wall such that the threaded part enables the wall mounted air conditioner (AC) unit to be installed or removed from outside of the railway instrument house,
   wherein the threaded part is a rivet nut with internal threads for placing permanent threads in the outer metal shell layer such that once in place the internal threads are ready for a stud such that the rivet nut eliminates a need to have a person inside the railway instrument house during installation and disassembly of the wall mounted air conditioner (AC) unit,
   wherein the rivet nut includes a deformable shank such that the rivet nut and the stud to provide a solution for fastening resilient nut/stud threads to the outer metal shell layer,
   wherein the rivet nut comes in without compression such that the rivet nut is installed onto the outer metal shell layer before the wall mounted air conditioner (AC) unit and an AC unit cage are installed and the rivet nut is compressed after the wall mounted air conditioner (AC) unit and the AC unit cage are installed on to the outer metal shell layer,
   wherein the AC unit cage having at least two side doors and a front door such that each side door of the at least two side doors is locked inside the AC unit cage by corresponding bolts or a quick lock,
   wherein access to the corresponding bolts or the quick lock is blocked by a front door frame of the front door, and
   wherein the AC unit cage has the front door sized such that it allows a customer to replace the wall mounted air conditioner (AC) unit without removing the AC unit cage.

2. The mounting assembly of claim 1, wherein for installation of the wall mounted air conditioner (AC) unit no holes are cut in the middle insulation layer and the inner plywood layer.

3. The mounting assembly of claim 1, wherein the rivet nut having a flange that extends above the outer metal shell layer in which it is installed.

4. The mounting assembly of claim 1, further comprising:
   a plurality of cage mounting holes for mounting the AC unit cage to the house wall, wherein the plurality of cage mounting holes are located inside the AC unit cage.

5. The mounting assembly of claim 1, further comprising:
   a plurality of cage mounting bolts, wherein access to the plurality of cage mounting bolts is blocked by a side door frame of the each side door of the at least two side doors.

* * * * *